United States Patent [19]

Houston

[11] Patent Number: 4,956,814
[45] Date of Patent: Sep. 11, 1990

[54] MEMORY CELL WITH IMPROVED SINGLE EVENT UPSET RATE REDUCTION CIRCUITRY

[75] Inventor: Theodore W. Houston, Richardson, Tex.

[73] Assignee: Texas Instruments Incorporated, Dallas, Tex.

[21] Appl. No.: 252,200

[22] Filed: Sep. 30, 1988

[51] Int. Cl.⁵ .......................................... G11C 11/40
[52] U.S. Cl. ................................................. 365/154
[58] Field of Search ................ 365/154, 155, 156, 190

[56] References Cited

U.S. PATENT DOCUMENTS

| 4,387,444 | 6/1983 | Edwards | 365/156 |
| 4,725,981 | 2/1988 | Rutledge | 365/154 |
| 4,779,226 | 10/1988 | Haraszti | 365/156 |

OTHER PUBLICATIONS

"CMOS RAM Cosmic Ray–Induced Error Rate Analysis", J. C. Pickel, et. al., IEEE Trans. on Nuclear Science, vol. NS-28, pp. 3962-3967 (1981).

Primary Examiner—James W. Moffitt
Attorney, Agent, or Firm—Raymond E. Fritz, Jr.; Stanton C. Braden; Melvin Sharp

[57] ABSTRACT

The rate of single event upset in a memory cell due to energetic particle hits on a p-channel device is reduced by a pair of active devices in the cross-coupling between a pair of inverters. The active devices are controlled by voltages internal to the memory cell such that writing into the cell is not slowed significantly. Additionally, means such as a resistor or transistor are disclosed which reduce the rate of single event upset due to energetic particle hits on a n-channel device.

12 Claims, 8 Drawing Sheets

MEMORY CELL WITH IMPROVED SINGLE EVENT UPSET RATE REDUCTION CIRCUITRY

FIELD OF THE INVENTION

BACKGROUND OF THE INVENTION

The susceptability of integrated circuit memories to soft error or single event upset (SEU) is of particular concern in space. See E. G. Muller, M. S. Gussenhower, K. A. Lynch and D. H. Brenteger, "DMSP Dosimetry Data: A Space Measurement and Mapping of Upset Causing Phenomena". IEEE Trans. Nuclear Science NS-34, pp. 1251–1255 (1987) and H. T. Weaver, et al., "An SEU Tolerant Memory Cell Derived from Fundamental Studies of SEU Mechanisms in SRAM", IEEE Trans. Nuclear Science, NS-34, pp. 1281–1286 (1987). A soft error or single event upset typically is caused by electron-hole pairs created by, and along the path of, a single energetic particle as it passes through an integrated circuit, such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays. See T. C. May and M. H. Woods, "Alpha Particle Induced Soft Errors in Dynamic Memories", IEEE Trans. Electronic Devices, ED-26, p. 2 (1979) and J. C. Pickel, J. T. Blaudfood, Jr., "CMOS RAM Cosmic Ray Induced Error Rate Analysis" IEEE Trans. on Nuclear Science, Vol. NS-28, pp. 3962–3967 (1981). Alternatively, the critical charge may result from alpha particles (helium nuclei). One example of SEU can be seen in FIG. 1a which illustrates a cross-sectional view of a CMOS inverter. When alpha particle p strikes bulk semiconductor material in p-channel MOS transistor Pch, it generates electron-hole pairs as shown by the respective minus and plus marks. Assuming that n-channel transistor Nch is on and that p-channel transistor Pch is off, the holes (represented by + signs) which collect (see arrows toward drain D) at drain D can change the voltage at output OUT from a logic low to a logic high. The electrons as indicated by the minus signs will diffuse toward circuit supply voltage Vcc. A charge generating energetic particle hit on transistor Nch has the opposite effect with positive charges drifting towards ground and negative charges collecting at output OUT, thus possibly changing the logic state of the inverter with its n-channel transistor off and its p-channel transistor on.

Further background follows with reference to FIG. 1b which illustrates a schematic drawing of a conventional CMOS (complementary metal oxide semiconductor) static memory cell, typically used in a static random access memory (SRAM). (Note that the term metal used in the pharse metal oxide semiconductor is interpreted in semiconductor and related arts as also encompassing polycrystalline semiconductor material.) Memory cell 2 is constructed according to well known methods of cross-coupled inverter realization and thus CMOS inverters are used in memory cell 2. A first CMOS inverter 4 in memory cell 2 comprises p-channel transistor 6 and n-channel transistor 8 having their source-to-drain paths connected in series between voltage Vcc and ground, and having their gates tied together. The second CMOS inverter 5 in memory cell 2 is similarly constructed, with p-channel transistor 10 and n-channel transistor 12 having their source-to-drain paths connected in series between Vcc and ground and their gates also common. The cross-coupling is accomplished by the gates of transistors 6 and 8 being connected to the drains of transistors 10 and 12 (node S1 of FIG. 1b), and by the gates of transistors 10 and 12 being connected to the drains of transistors 6 and 8 (node S2 of FIG. 1b). N-channel pass transistor 14 has its source-to-drain path connected between node S2 and a first bit line BL, and has its gate connected to word line WL. N-channel pass transistor 16 similarly has its source-to-drain path connected between node S1 and a second bit line BL_, and has its gate also connected to word line WL. Pass transistors 14, 16 when enabled, allow data to pass into and out of memory cell 2 from bit lines BL and BL_ respectively. Bit lines BL and BL_ carry data into and out of memory cell 2. Pass transistors 14, 16 are enabled by word line WL which is a function of the row address in an SRAM. The row address is decoded by a row decoder in the SRAM such that one out of n word lines is enabled, where n is the number of rows of memory cells in the memory, which is a function of memory density and architecture.

In operation, the voltages of node S1 and S2 will necessarily be logical complements of one another, due to the cross-coupled nature of CMOS inverters 4, 5 within memory cell 2. When word line WL is energized by the row decoder (not shown), according to the row address received at address inputs to an address buffer (not shown) connected to the row decoder, pass transistors 14 and 16 will be turned on, coupling nodes S1 and S2 to bit lines BL_ and BL, respectively. Accordingly, when word line WL is high, the state of memory cell 2 can establish a differential voltage on BL and BL_. Alternatively, peripheral circuitry forcing a voltage on BL and BL_ can alter the state of memory cell 2. The sizes of the transistors shown in FIG. 1b are generally chosen such that when pass transistors 14 and 16 are turned on by word line WL; a differentially low voltage at bit line BL with respect to node S2 can force node S2 to a logic low level; and a differentially low voltage at bit line BL_ with respect to node S1 can force node S1 to a logic low level. However, the sizes of the transistors shown in FIG. 1 are also chosen such that when transistors 14 and 16 are on; a differentially high voltage at bit line BL with respect to node S2 will not force node S2 high; nor will differentially high voltage at bit line BL_ with respect to node S1 force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

One method for hardening a memory cell against SEU is by reducing the amount of charge generated by a given event. This is accomplished for example, by using a silicon film thinner than the collection depth in bulk material. For instance, a memory cell created on a thin film of semiconductor, such as in an SOI (silicon on insulator) device, is less susceptible to SEU than one created on bulk semiconductor, such as silicon, because ionization charge along a path in an insulator is more likely to recombine than be collected compared to ionization charge created in a semiconductor.

Another way to reduce the susceptibility of a memory cell to upset is by increasing the critical charge of the cell.

A hardening scheme against SEU in static memory cells based on increasing the critical charge required to produce SEU is illustrated in the schematic drawing of FIG. 2a. As shown, resistors 18 and 20 are included in the cross-coupling lines of inverters 4 and 5 and they increase the RC time constant delay associated with the gate capacitances of transistors 6, 8, 10, and 12. The initial effect of an energetic particle strike in a critical volume is to change the voltage of one node of the memory cell, say node S1. Upset will occur if this change in voltage propagates through the cross coupling of inverters 4 and 5 before the initial voltage of node S1 is restored. The increased RC delay slows the feedback propagation through the cross coupling and allows more time for recovery of the initially affected node. However, this increase in RC propagation delay also slows the write cycle time of cell 2. The write cycle of a static memory cell in a static random access memory (SRAM) has typically been faster than the read cycle so that some slowing of the write cycle has been acceptable, since the read cycle time was the most critical. However, with scaling of memory cells to small geometries, the speed of the write cycle of SEU hardened cells has become critical. Weaver, op. cit. introduced resistors R1 and R2 to protect against hits on the p-channel transistors 6 and 10 of his inverters as shown in the schematic drawing of FIG. 2b which illustrates the Weaver SEU reduction scheme. However, resistors R3 and R4 are still needed to protect against hits on n-channel transistors 8 and 12, thus limiting the WRITE speed of Weaver's memory cell. Therefore, this resistive approach to SEU hardening is no longer desirable.

Another hardening scheme against SEU based on increasing the critical charge is to increase the capacitance on the inverter drains, thus decreasing the voltage change on the node for a given amount of collected charge. The effectiveness of the capacitance in increasing the critical charge for SEU is increased by having the capacitance between the drains of the two inverters, which, with the cross coupling, is the same as between the gate and drain of the same inverter, as shown in FIG. 2c. FIG. 2c illustrates the same circuit schematic as FIG. 1b with the exception that capacitor 21 is connected across the drains of the transistors of inverters S1 and S2. By having the capacitance between the gate and drain of the inverter, the effect of the capacitance is increased by Miller capacitance. Also, with the capacitance from gate to drain, a change in the drain voltage induces a change in the gate voltage such that the restoring current is increased. Increased capacitance o the gate will also increase the RC delay in the feed back path, thus increasing resistance to SEU and also slowing the write; however, so long as the resistance in the cross-coupling is small, this effect will be minimal. Thus, capacitor 21 can reduce the rate of SEU. However, two constraints must be met. First, capacitor 21 must be small in size in order to meet small circuit geometry requirements. Second, the capacitance of capacitor 21 must be maintained at a certain level in order to insure sufficient SEU hardening. As the level of memory density increases, the need is ever heightened for increased capacitance within the small circuit geometry constraint.

OBJECTS OF THE INVENTION

It is an object of the invention to provide a new and improved memory cell.

It is another object of the invention to provide an new and improved memory cell for use in a static random access memory.

It is another object of the invention to provide a new and improved memory cell having increased hardness against single event upset.

These and other objects of the invention, together with the features and advantages thereof, will become apparent from the detailed specification when read together with the accompanying drawings in which applicable reference numerals have been carried forward.

SUMMARY OF THE INVENTION

The foregoing objects of the invention are accomplished by a memory cell comprising a first device and a second device, cross-coupled so that the output of the first device is connected to the input of the second device and the output of the second device is connected to the input of the first device. At least one active device is connected to the cross-coupling of the first and second device to protect against an energetic particle hit on the first device. Means are also provided in the memory cell to protect against a hit on the second device.

DETAILED DESCRIPTION OF THE INVENTION

Figure 1A:
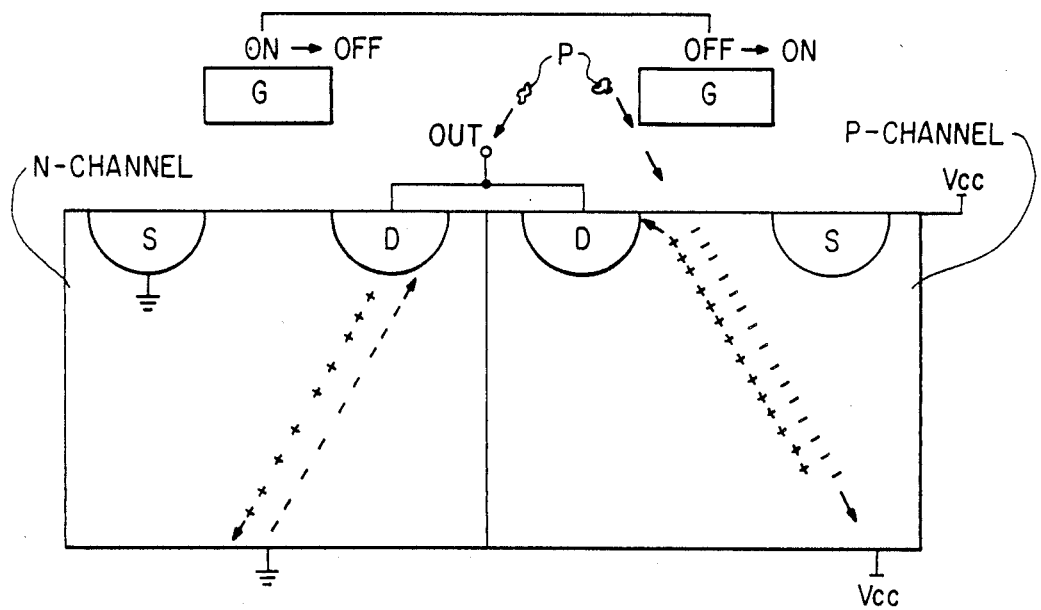
FIG. 1a is a cross-sectional view of a CMOS inverter.
Figure 1B:
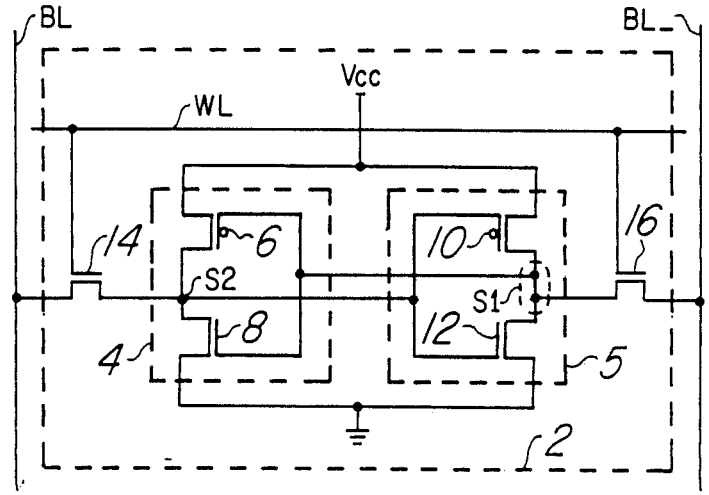
FIG. 1b is a schematic drawing of a conventional memory cell typically used in an SRAM.
Figure 2A:
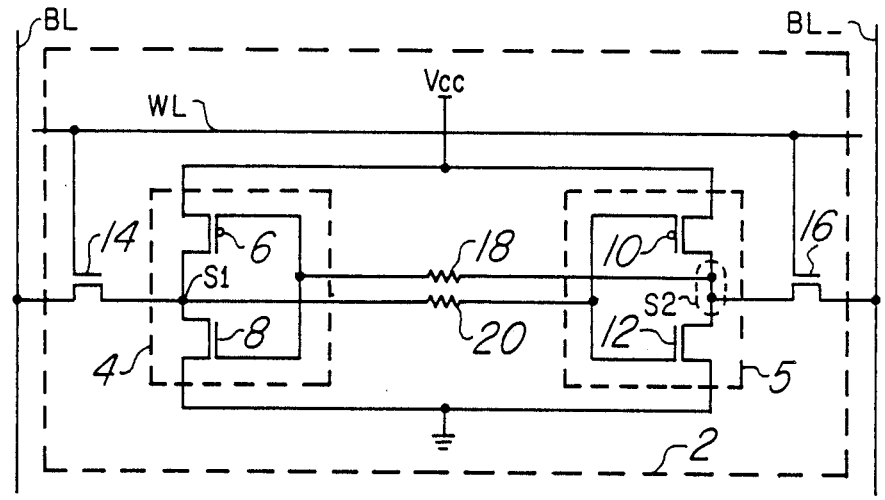
FIGS. 2a through 2c are schematic drawings of prior art SEU hardening schemes.
Figure 2B:
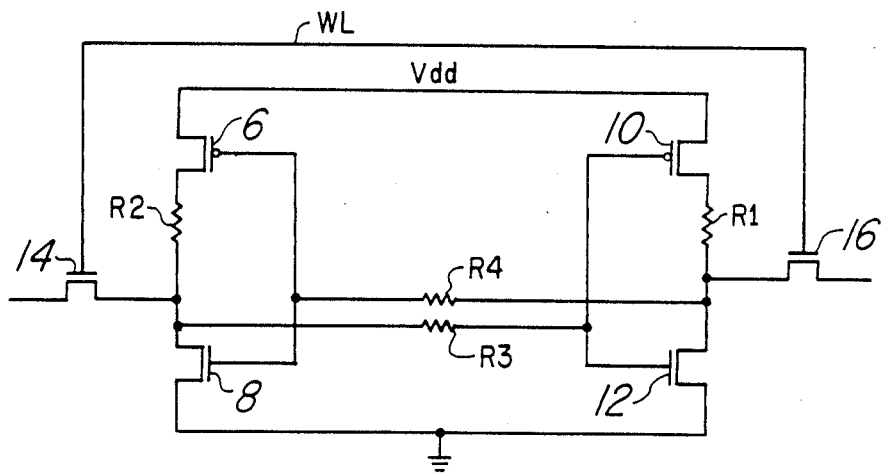
Figure 2C:
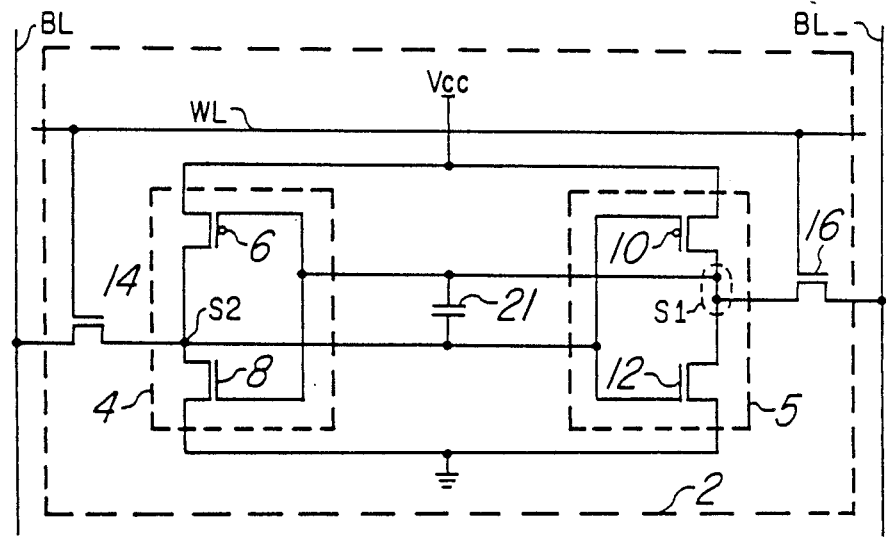
Figure 3A:
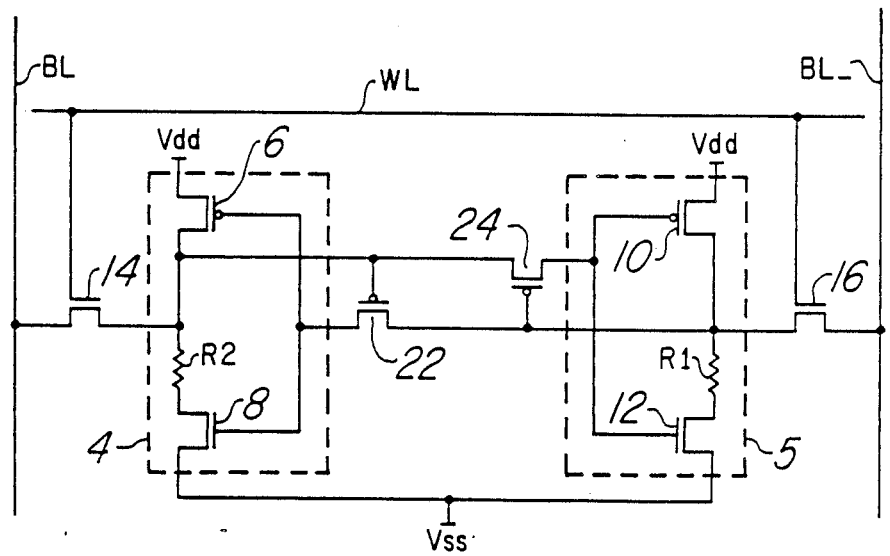
FIGS. 3a through 4b and FIG. 4d are schematic drawings of alternative embodiments of the invention.

The invention places active devices, such as a pair of p-channel transistors (preferably metal oxide semiconductor (MOS) transistors in order to fit compactly and conserve space in a memory cell) in the cross coupling of a memory cell. A schematic drawing of an integrated circuit which includes a first preferred embodiment of the invention is illustrated in FIG. 3a. Note that for optimum SEU hardness that this circuit is built on an insulator body (although it can be built on bulk semiconductor material) and therefore can be classified as an SOI device. However, in a bulk embodiment, particular benefit is obtained if at least the devices in the cross-coupling are isolated from the bulk as could be done with stacked polysilicon transistors. FIG. 3a illustrates the same circuit schematic as shown in FIG. 1b with the exception that p-channel transistors 22 and 24 are connected across an associated cross-coupling line joining a gate of one inverter to the drain of another. The gate of transistor 22 is connected to a source/drain or terminal of transistor 24 and the gate of transistor 24 is connected to the source/drain or terminal of transistor 22. Further, resistor R1 is connected to and between node S1 and the drain of transistor 12. Additionally, resistor R2 is connected to and between the node S2 and the drain of transistor 8.

Demonstration of the operation of the circuit in FIG. 3a shall be shown by example. The p-channel nature of transistors 22, 24 increases their conductance with negative gate to source voltage and therefore the feedback mechanism for writing into the memory cell is not slowed significantly. For the case where node S1 is initially logic high and node S2 is initially logic low, when attempting to write the opposite state into memory cell 2, node S1 must first be pulled to logic low. This logic low transition must be transmitted through transistor 22 which is in its most turned on state, to the common gate of transistors 6 and 8. Node S2 then changes from its initial logic low state to a logic high state in response to a low voltage at the gates of transistors 6 and 8. However, the transition of node S2 from low to high is transmitted through transistor 24, the gate of which is now at a voltage causing transistor 24 to be in a higher conducting state (logic low). Note that while the WRITE is accomplished through transistors 22 and 24 in their most turned on state, the voltage maintaining feedback in memory cell 2 must always go through transistors 22 and 24, one of which is always in a lower conducting state (gate high). This feedback can alternatively be maintained by leakage or subthreshold current, meaning that enhancement mode transistors or depletion mode transistors can be used as transistors 22 and 24.

If transistors 6 or 10 are hit by a particle which changes the logic state at the output of an inverter, memory cell 2 is able to recover from the hit due primarily to the added resistance provided in the crosscoupling by the resistive paths between source and drain regions of transistors 22 and 24 when each is in its lower conducting state. The effect of the added resistance increases the RC time constant delay, therefore allowing more time for recovery before the negative effect of the SEU induced voltage change propagates through memory cell 2. Resistors R1 and R2 provide resistive barriers to limit the amount of voltage drop occurring at nodes S2 and S1 resulting from a sufficiently charged hit on n-channel transistors 8 and 12 respectively. Although the capacitance and resistance provided by transistors 22 and 24 reduce the rate of SEU caused by hits on n-channel transistors 8,12 to some degree, resistors R1 and R2 account for significant reduction in SEU than would have resulted in a circuit without resistors R1 and R2 due to a hit on n-channel transistors 8 and 12.

Figure 3B:
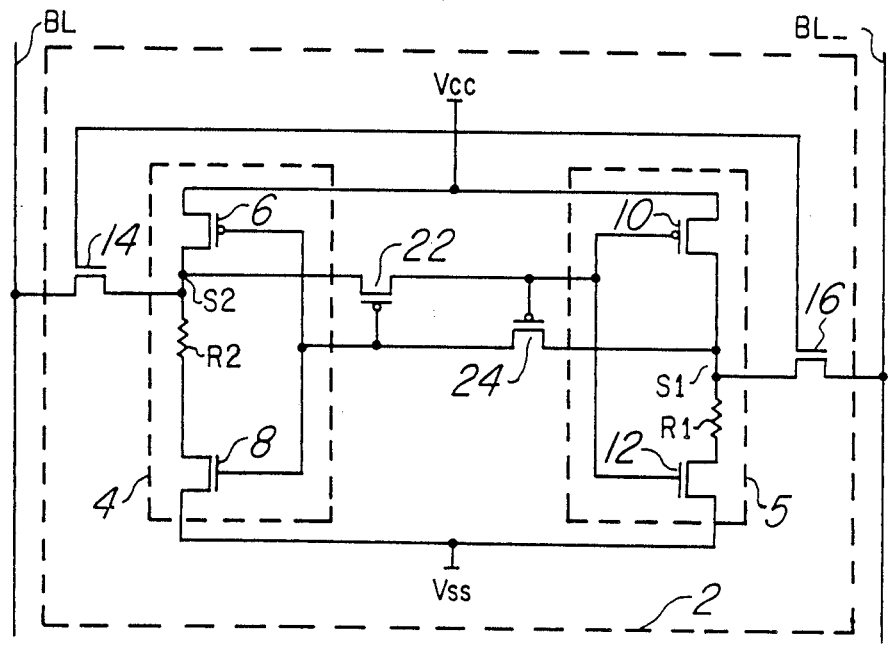

FIG. 3b illustrates a schematic drawing of an alternative embodiment of the invention. This circuit may be viewed as the same circuit shown in FIG. 3a with the transistor 22 and 24 exchanged in position and numerical label with one another. The discussion of the operation of the circuit in FIG. 3a applies completely to the operation of the circuit in FIG. 3b by substituting transistor labels "22" with "24" and "24" with "22".

Figure 3C:
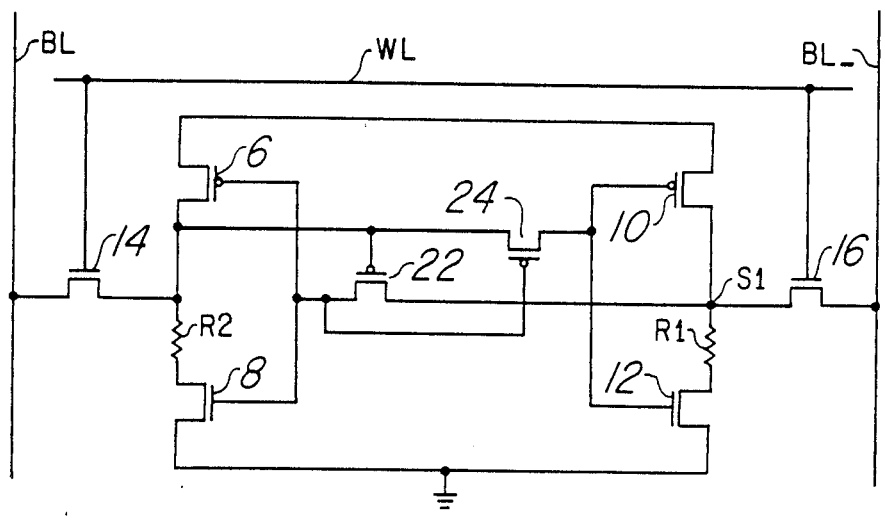

Another alternative embodiment of the invention connects the gate of transistor 24 to the input of inverter 4 as illustrated in FIG. 3c.

Figure 3D:
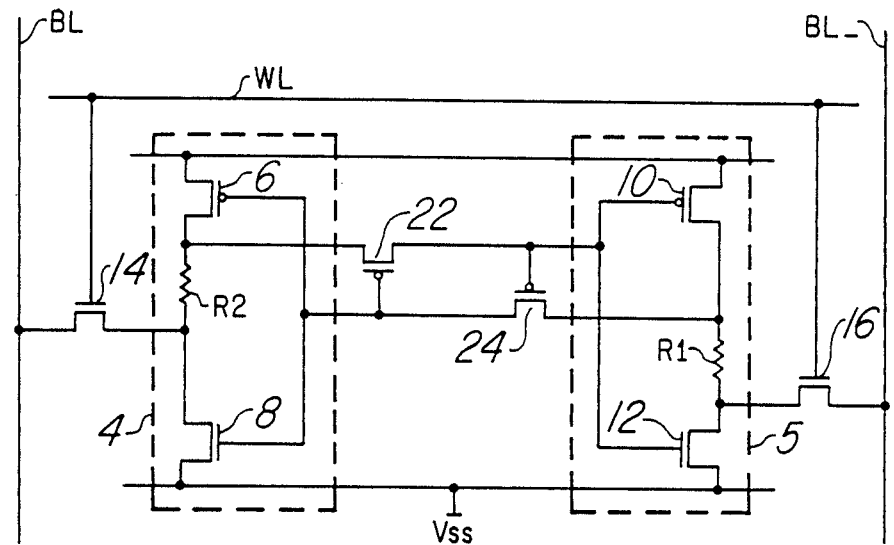

Still another alternative embodiment of the invention is illustrated in the schematic drawing of FIG. 3d. FIG. 3d is the same as FIG. 3b except that pas transistors 14 and 16 have a drain/source connected to the drain of the n-channel transistor of an inverter instead of the drain of the p-channel transistor of an inverter as shown in FIGS. 3a and 3b. Alternatively, the n-channel drain connection can be applied to the circuit illustrated in FIG. 3a. The result of these embodiments is a faster READ operation (than when using a p-channel drain connection) but a slower WRITE operation ( than when using a p-channel drain connection).

Figure 3E:
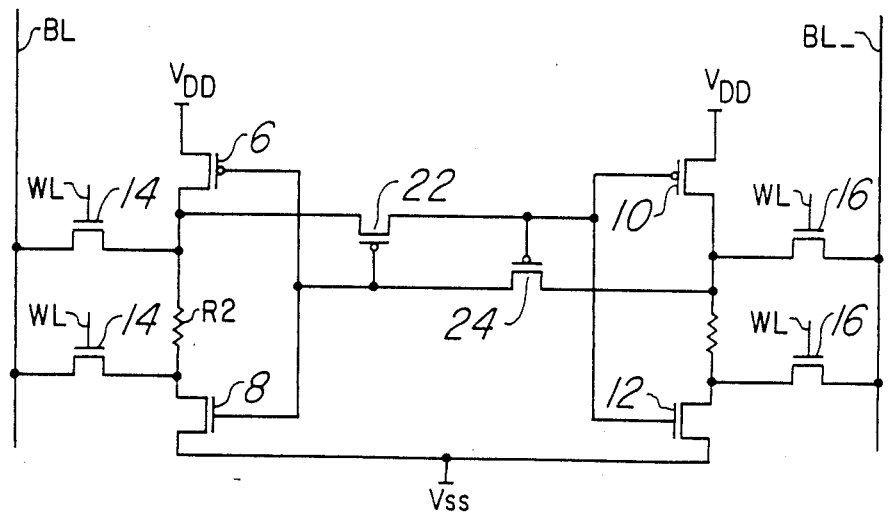

Another alternative embodiment of the invention is shown in the schematic drawing of FIG. 3e. This figure is similar to FIG. 3b except that it has two pass transistors on each side of the cell with a drain/source of one pass transistor on a side connected to the drain of the p-channel inverter transistor and the drain/source of the other pass transistor on the same side of the cell connected to the drain of the n-channel inverter transistor. This embodiment allows both a fast READ and a fast WRITE. Both pass transistors on a side of the cell can be turned on for both READ and WRITE. Alternatively, separate READ and WRITE word lines which turn on the pass transistors could be used. All of the above additions can likewise apply to the circuit shown in FIG. 3a.

Figure 3F:
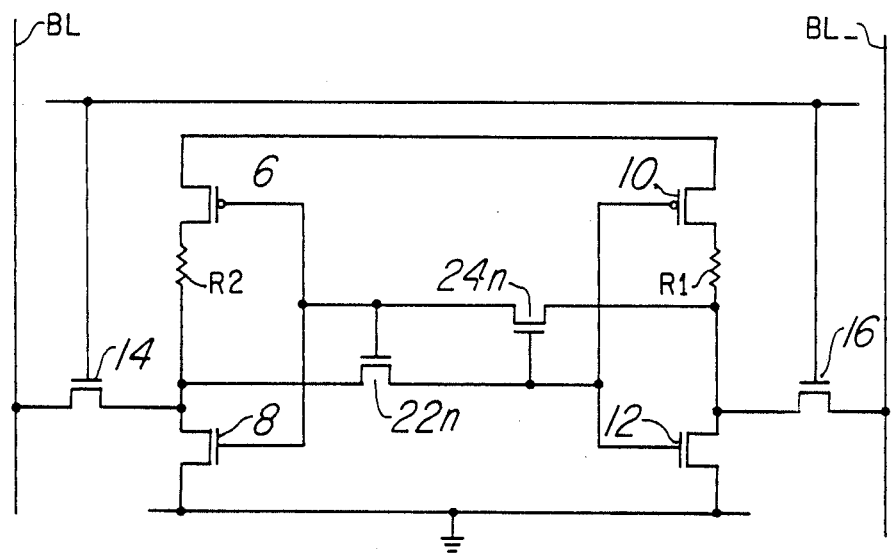

Still another embodiment of the invention is illustrated in the schematic drawing of FIG. 3f. This drawing is the same as that shown in FIG. 3a with the exception that n-channel transistors 22n and 24n have been substituted for p-channel transistors 22 and 24 respectively. Here, n-channel transistors 22n and 24n protect against a hit on n-channel transistors 8 and 12 while resistors R1 and R2 protect against a hit on p-channel transistors 6 and 10. This circuit has its greatest benefit when WRITE is accomplished by pulling the low side high.

Figure 4A:
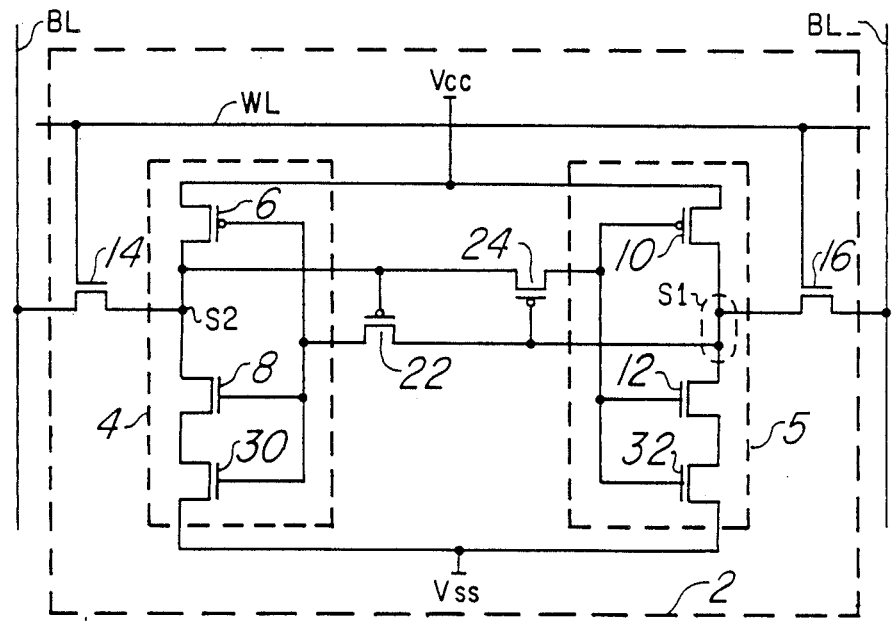
FIG. 4c illustrates a plurality of superimposed mask portions which indicate a possible layout of the invention.

A second preferred embodiment of the invention is illustrated in the schematic drawing of FIG. 4a. FIG. 4a is the same as that shown in FIG. 3b except that n-channel transistor 30 has been added and resistor R2 has been eliminated. The gate of transistor 30 is common with the gates of transistors 6 and 8. Additionally, n-channel transistor 32 has been added and resistor R1 has been eliminated. The gate of transistor 32 is common with the gates of transistors 10 and 12. Increased protection from single event upset caused primarily by an energetic particle hit on the n-channel devices is provided since there is a low probability of a simultaneous hit on both n-channel transistors in a single inverter 4 or 5.

Figure 4B:
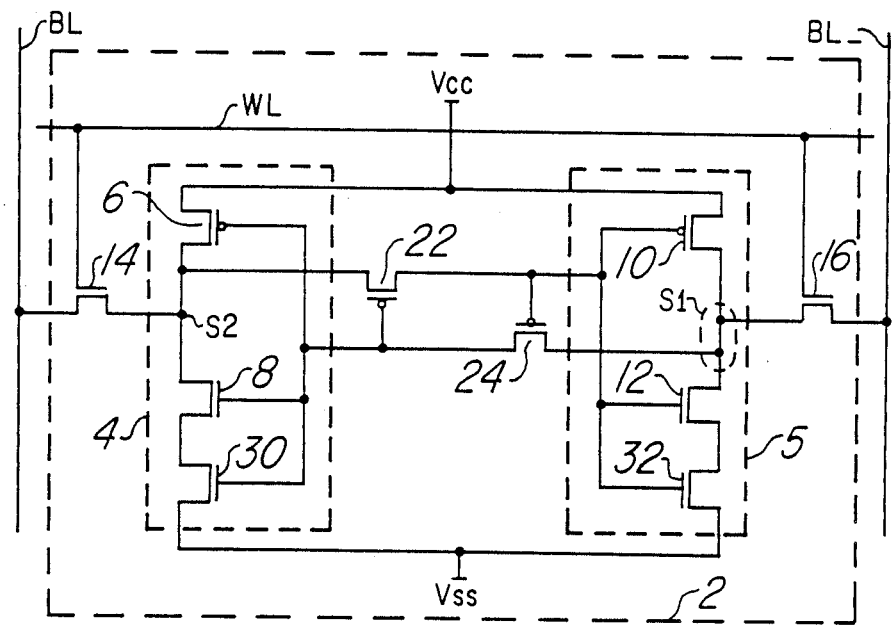

FIG. 4b illustrates a schematic drawing of an alternative embodiment of the second preferred embodiment of the invention. This circuit may be viewed as the same circuit shown in FIG. 4a with the transistors 22 and 24 exchanged in position and numerical label with one another. The discussion of the operation of the circuit in FIG. 4a applies substantially to the operation of the circuit in FIG. 4b by exchanging transistor labels "22" with "24" and "24" with "22".

Figure 4C:
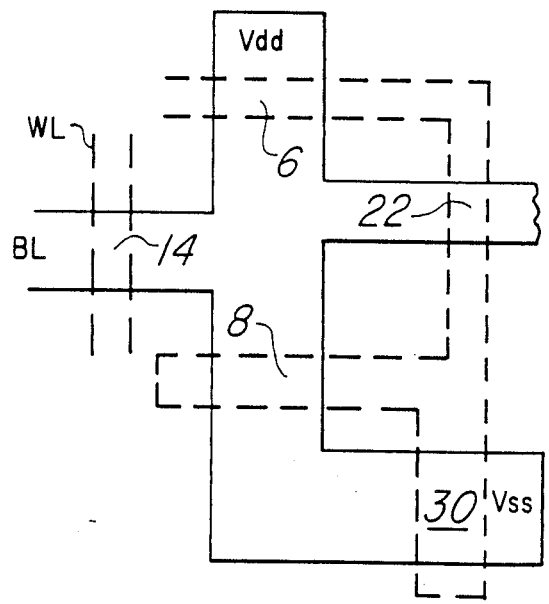

The likelihood of SEU is further reduced, in the embodiment shown in FIGS. 4a and 4b, by spatially separating transistor 8 from transistor 30 and by spatially separating transistor 10 from transistor 32. One possible way of doing this is shown in FIG. 4c with respect to transistors 8 and 30; which illustrates the relative positions of a plurality of superimposed photolithographic mask portions used to possibly construct the circuit whose schematic is shown in FIG. 4b. FIG. 4c illustrate the positions of elements on the left half of FIG. 4b, however, the same spatial separation can be applied to the elements on the right half of FIG. 4b. The common gates of transistors 22, 6, 8, and 30 are shown as dashed lines and the labels of the transistors, indicating their relative positions, are also shown. Note that transistors 8 and 30 are spaced away from one another at substantially right angles. However, this illustration is provided for example only and therefore a large number of other possibilities exists for separating these transistors and positioning other elements of the circuits shown.

Figure 4D:
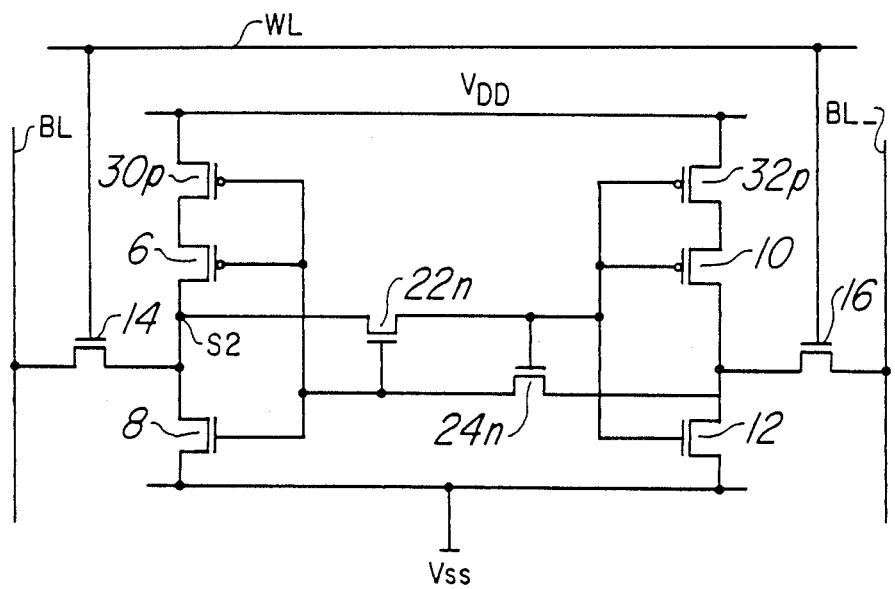

Another alternative embodiment of the invention is illustrated in FIG. 4d. Here, n-channel transistors 22n and 24n are connected in the cross-coupling while p-channel transistors 30p and 32p are connected in series with the p-channel transistor of an associated inverter. This figure is the n-channel case of the drawing of FIG. 4b.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. N-channel transistors may be substituted for the previously discussed p-channel transistors 22 and 24 in the cross coupling especially as long as writing into the memory cell is accomplished by pulling the low node high. While the requirements for resistance to SEU have focused on memory cells, this invention also applies to reducing the SEU susceptibility of a single latch. Also, p-channel transistors may be substituted with n-channel transistors. Further, transistors may be connected to the cross-coupling of inverters of a variety other than the CMOS inverters illustrated in the foregoing drawings. Additionally, it is possible to use the invention without placement of active devices, such as transistors, in the cross-coupling of the inverters in order to reduce the rate of SEU. It is contemplated that all such changes and additional embodiments are within the spirit and true scope of the invention as claimed below.

I claim:

1. A bi-stable logic device comprising:
   a set of cross-couple inverters, said set of inverters including first and second inverters, each inverter including a n-channel transistor and a p-channel transistor, the gate of the n-channel transistor being connected to the gate of the p-channel transistor;
   a device connected to and between the drains of said p-channel and n-channel transistors of at least one inverter, said device being capable of providing at least a selected level of impedance between said drains of said p-channel and n-channel transistors; and
   a pair of transistors, each having a gate, first and second terminals, connected to the cross-coupling of the inverters so as to provide a time delay in effecting voltage changes at selected nodes within the cell via an impedance path through said pair of transistors which lies between said selected nodes, the gate of a first transistor of said pair being connected to a first terminal of a second transistor of said pair in addition to the gate of a second transistor of said pair being connected to a first terminal of said first transistor.

2. A bi-stable logic device as recited in claim 1 wherein said second terminal of said first transistor of said pair is connected to the input of said first inverter and wherein said first terminal of said first transistor of said pair is connected to the output of said second inverter.

3. A bi-stable logic device as recited in claim 2 wherein said second terminal of said second transistor of said pair is connected to said input of said second inverter and wherein said first terminal of said second transistor of said pair is connected to said output of said first inverter.

4. A bi-stable logic device as recited in claim 1 wherein said second terminal of said first transistor of said pair is connected to the output of said first inverter and wherein said first terminal of said first transistor of said pair is connected to the input of said second inverter.

5. A bi-stable logic device as recited in claim 4 wherein said second terminal of said second transistor is connected to said output of said second inverter and wherein said first terminal of said second transistor of said pair is connected to said input of said first inverter.

6. A bi-stable logic device as recited in claim 1 wherein said field effect transistors are metal oxide semiconductor transistors.

7. A bi-stable logic device as recited in claim 1 wherein said device connected to and between the drains of said p-channel and n-channel transistors is a resistor.

8. A bi-stable logic device as recited in claim 1 wherein said device connected to and between the drains of said p-channel and n-channel transistors is a transistor.

9. A bi-stable logic device as recited in claim 1 wherein said transistors of said pair are p-channel transistors.

10. A bi-stable logic device as recited in claim 9 wherein said transistor connected to and between the drains of said p-channel and n-channel transistors is an n-channel transistor.

11. A bi-stable logic device as recited in claim 1 wherein said transistors of said pair are n-channel transistors.

12. A bi-stable logic device as recited in claim 11 wherein said transistor connected to and between the drains of said p-channel and n-channel transistors is a p-channel transistors.

* * * * *